(12) United States Patent
Liu et al.

(10) Patent No.: US 7,787,295 B2
(45) Date of Patent: *Aug. 31, 2010

(54) INTEGRATED CIRCUIT EMBEDDED WITH NON-VOLATILE MULTIPLE-TIME PROGRAMMABLE MEMORY HAVING VARIABLE COUPLING

(75) Inventors: David Liu, Fremont, CA (US); John Nicholas Gross, San Francisco, CA (US)

(73) Assignee: Jonker LLC, Zephyr Cove, NV (US)

( * ) Notice: Subject to any disclaimer, the term of this patent is extended or adjusted under 35 U.S.C. 154(b) by 145 days.

This patent is subject to a terminal disclaimer.

(21) Appl. No.: 12/271,695

(22) Filed: Nov. 14, 2008

(65) Prior Publication Data

US 2009/0122605 A1 May 14, 2009

Related U.S. Application Data

(63) Continuation-in-part of application No. 12/264,076, filed on Nov. 3, 2008, and a continuation-in-part of application No. 12/264,060, filed on Nov. 3, 2008, and a continuation-in-part of application No. 12/264,029, filed on Nov. 3, 2008.

(60) Provisional application No. 60/987,869, filed on Nov. 14, 2007.

(51) Int. Cl.
*G11C 16/00* (2006.01)
(52) U.S. Cl. .............................. 365/185.03; 365/185.01
(58) Field of Classification Search ............ 365/185.01, 365/185.08
See application file for complete search history.

(56) References Cited

U.S. PATENT DOCUMENTS

| 4,412,311 | A | * | 10/1983 | Miccoli et al. | ......... 365/185.01 |
|---|---|---|---|---|---|
| 5,548,146 | A | * | 8/1996 | Kuroda et al. | ................ 257/321 |
| 5,586,073 | A | * | 12/1996 | Hiura et al. | ............ 365/185.01 |
| 6,441,443 | B1 | | 8/2002 | Hsu et al. | |
| 6,489,202 | B1 | | 12/2002 | Hsu et al. | |
| 6,501,685 | B2 | | 12/2002 | Hsu et al. | |
| 6,631,087 | B2 | * | 10/2003 | Di Pede et al. | ......... 365/185.18 |
| 6,678,190 | B2 | | 1/2004 | Yang et al. | |
| 6,920,067 | B2 | | 7/2005 | Hsu et al. | |
| 2005/0023656 | A1 | | 2/2005 | Leedy | |
| 2006/0057798 | A1 | | 3/2006 | Komori et al. | |
| 2006/0067124 | A1 | | 3/2006 | Lee et al. | |
| 2007/0047302 | A1 | | 3/2007 | Lee et al. | |

(Continued)

OTHER PUBLICATIONS

Clendenin, Mike; "Flash maker eMemory gaining foundry converts," EE Times Asia, Nov. 6, 2003, 2 pages.

(Continued)

*Primary Examiner*—Tan T. Nguyen
(74) *Attorney, Agent, or Firm*—J. Nicholas Gross, Atty

(57) ABSTRACT

A multi-programmable non-volatile device is operated with a floating gate that functions as a FET gate that overlaps a portion of a source/drain region and allows for variable coupling through geometry and/or biasing conditions. This allows a programming voltage for the device to be imparted to the floating gate through variable capacitive coupling, thus changing the state of the device. The invention can be used in environments such as data encryption, reference trimming, manufacturing ID, security ID, and many other applications.

46 Claims, 7 Drawing Sheets

U.S. PATENT DOCUMENTS

| | | | |
|---|---|---|---|
| 2007/0247902 A1 | 10/2007 | Chen et al. | |
| 2007/0255893 A1 | 11/2007 | Takeuchi | |
| 2008/0186772 A1* | 8/2008 | Horch | 365/185.18 |
| 2008/0225593 A1 | 9/2008 | Mitros et al. | |

OTHER PUBLICATIONS

Clendenin, Mike; "eMemory extends OTP to 0.15 μm high voltage process," EE Times Asia, Jul. 26, 2006, 1 page.

Datasheet, "Numonyx Embedded Flash Memory(J3vD)," Dec. 2007, 66 pages.

UMC, "Embedded Memory SoC Process Technology," undated, 8 pages.

International Search Report and Written Opinion for PCT/US2008/82294, mailed Dec. 19, 2008, 8 pages.

International Search Report and Written Opinion for PCT/US2008/83697, mailed Jan. 9, 2009, 21 pages.

Non Final Office Action for U.S. Appl. No. 12/264,029 mailed May 27, 2010, 11 pages.

Non Final Office Action for U.S. Appl. No. 12/264,060 mailed May 28, 2010, 12 pages.

Non Final Office Action for U.S. Appl. No. 12/264,076 mailed Jun. 1, 2010, 10 pages.

* cited by examiner

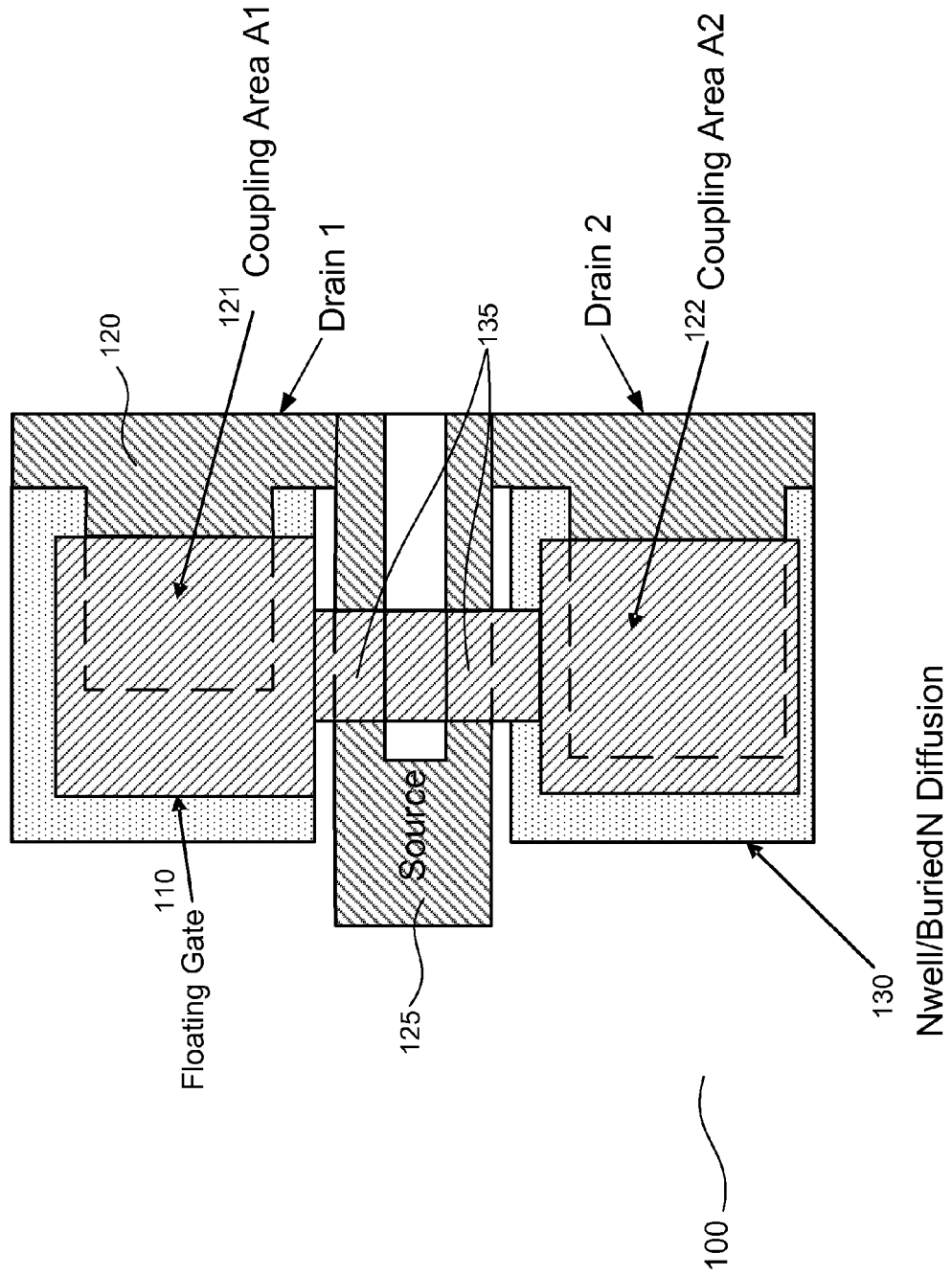

INTEGRATED CIRCUIT EMBEDDED WITH NON-VOLATILE MULTIPLE-TIME PROGRAMMABLE MEMORY HAVING VARIABLE COUPLING

RELATED APPLICATION DATA

The present application claims the benefit under 35 U.S.C. 119(e) of the priority date of Provisional Application Ser. No. 60/987,869 filed Nov. 14, 2007 which is hereby incorporated by reference. The application also claims priority to and is a continuation-in-part of Ser. Nos. 12/264,029,12/264,060 and 12/264,076 all filed Nov. 3, 2008 which are hereby incorporated by reference.

The application is also related to the following applications, all of which are filed on this same date and hereby incorporated by reference herein:

INTEGRATED CIRCUIT EMBEDDED WITH NON-VOLATILE PROGRAMMABLE MEMORY HAVING VARIABLE COUPLING Ser. No. 12/271,647

METHOD OF MAKING INTEGRATED CIRCUIT EMBEDDED WITH NON-VOLATILE PROGRAMMABLE MEMORY HAVING VARIABLE COUPLING Ser. No. 12/271,666

Method of Operating Integrated Circuit Embedded with NON-VOLATILE PROGRAMMABLE MEMORY HAVING VARIABLE COUPLING Ser. No. 12/271,680

FIELD OF THE INVENTION

The present invention relates to non-volatile memories with variable coupling which can be programmed multiple times. The invention has particular applicability to applications where is it desirable to customize electronic circuits.

BACKGROUND

One time programmable (OTP) and multi-time programmable (MTP) memories have been recently introduced for beneficial use in a number of applications where customization is required for both digital and analog designs. These applications include data encryption, reference trimming, manufacturing ID, security ID, and many other applications. Incorporating OTP and MTP memories nonetheless typically comes at the expense of some additional processing steps.

A new form of OTP is disclosed in the aforementioned U.S. application Ser. No. 12/264,029 and which is incorporated by reference herein. In that disclosure, a new type of single-poly non-volatile memory device structure can be operated either as an OTP (one time programmable) or as an MTP (multiple time programmable) memory cell is disclosed. The device structure is fully compatible with advanced CMOS logic process, and would require, at the worst case, very minimal additional steps to implement. A unique aspect of the device is that the floating gate of the memory cell structure is electrically coupled strongly through one of the S/D junctions of the transistor, whereas traditional single poly nonvolatile memory cells require either an additional interconnect layer to couple to the floating gate, or the floating gate has virtually none or minimal electrical coupling to any of the existing electrical signals.

Another key feature is that it is implemented with an NMOS device structure, whereas the traditional single-poly OTP is commonly implemented with a PMOS device structure. This means that the device can be formed at the same time as other n-channel devices on a wafer.

Another advantage of an NMOS device structure is that it behaves similar to an EPROM device, i.e., the device is programmed into a non-conducting state from a conducting state. (The most commonly used PMOS OTP device is programmed from a non-conducting state into a conducting state). This can eliminate the need of an additional masking step that is commonly associated with a PMOS OTP device in order to make sure that PMOS device is in a non-conducting state coming out of the manufacturing fab. In addition, since an NMOS device's programming mechanism with channel hot electrons injection is self-limiting, unlike that case of a PMOS with channel hot electron programming, the amount of energy consumption during programming is self-limited for this invention.

An additional benefit of the aforementioned device is the fact that multi-level functionality can be incorporated very easily by simply employing different forms of variable electrical coupling as discussed below. The ability to have OTP and MTP cells capable of storing n bits—instead of merely one—is believed to be unique to the aforementioned device.

Another NMOS OTP implementation is disclosed by U.S. Pat. No. 6,920,067, incorporated by reference herein. The device in this reference is programmed with channel hot-hole-injection. The disclosure teaches that the device is programmed into conducting state, after the channel hot hole injection. However, it is unclear whether the device actually works in the way the inventors claim. That is, it is not apparent that the channel current will be initiated to induce hot-hole-injection since the state of the floating gate is unknown and there is no available means to couple a voltage unto the floating gate. An NMOS device will conduct a channel current to initiate the hot hole injection only when the floating gate potential is sufficient to turn on the device, or when the threshold voltage is always low initially to allow channel current conduction. The only way to ensure either scenario is to introduce an additional process step to modify the turn on characteristics of the NMOS. Now assuming the channel is conducting initially and hot holes are injected, the holes injected on the floating gate will make the device more conductive. So the device basically goes from a conductive state (in order to initiate channel current for hot hole injection) to a highly conductive state. This is not a very optimal behavior for a memory device.

Another prior art device described in U.S. publication no. 2008/0186772 (incorporated by reference herein) shows a slightly different approach to the problem of providing a programming voltage to a floating gate embodiment of an OTP device. In this design, shown in FIG. 4, the drain border length L1 is increased relative to the source side length L1 to increase a coupling ratio to the eraseable floating gate 416. By increasing the coupling ratio, the amount of channel current is increased; therefore the charge injection into the floating gate will also increase. The drawbacks of this cell, however, include the fact that the cell and channel 412 must be asymmetric, and the coupling is only controlled using the length dimension of the active regions. Because of these limitations, it also does not appear to be extendable to a multi-level architecture. Moreover, it apparently is only implemented as a p-channel device.

Accordingly there is clearly a long-felt need for a floating gate type programmable memory which is capable of addressing these deficiencies in the prior art.

SUMMARY OF THE INVENTION

An object of the present invention, therefore, is to overcome the aforementioned limitations of the prior art.

A first aspect of the invention therefore concerns a programmable multi-state non-volatile device situated on a substrate comprising: a floating gate; wherein the floating gate is comprised of a material that is also used as a gate for a transistor device also situated on the substrate and associated with a logic gate and/or a volatile memory; a source region; and a drain region; and an n-channel coupling the source region and the drain region; wherein the drain region overlaps a sufficient portion of the gate such that a programming voltage for the device applied to the drain can be imparted to the floating gate through capacitive coupling; further wherein the device is adapted so that more than one bit of information can be stored by the programming voltage.

In this multi-state embodiment, the device is preferably adapted such that during a read operation only a portion of the drain region receives a read voltage. That is, a portion or all of the drain region can be biased during a program operation to vary an amount of information stored in the device. In some instances the device can be read by a bias voltage applied to the drain region which is adjusted with time to determine a threshold voltage of the floating gate.

In other preferred embodiments the floating gate can be erased to allow the device to re-programmed. Preferably the floating gate is eraseable by an erase voltage applied to the source region.

In some applications the device can be integrated as part of a programmable array embedded with separate logic circuits and/or memory circuits in an integrated circuit. Such circuit may be one of the following: a data encryption circuit; a reference trimming circuit; a manufacturing ID; a security ID, or any other circuit that requires customized non-volatile data.

In some embodiments the capacitive coupling can take place in a first trench situated in the substrate. These trenches may be part of an embedded DRAM array. The amount of coupling can be tailored as desired based on selective control of a gate—interconnect mask, a source/drain diffusion mask, or both.

Other configurations can include a second programmable device coupled in a paired latch arrangement such a datum and its compliment are stored in the paired latch.

To program the device to a multi-level state, a variable programming voltage is preferably used. This allows for multiple bits of data to be written by the programming voltage.

Another aspect of the invention concerns a multi-level one-time programmable (MOTP) device situated on a substrate comprising: a floating gate; wherein the floating gate is comprised of a material that is also shared by an interconnect and/or another gate for a transistor device also situated on the substrate and associated with a logic gate and/or a volatile memory; a source region; and a drain region overlapping a portion of the floating gate, and the drain region including at least a first drain region and a second selectable drain region; wherein a variable capacitive coupling between the drain region and the floating gate can be effectuated by one or more selection signals applied to the first drain region and the second drain region respectively; wherein the variable capacitive coupling causes a variable amount of channel hot electrons from the first drain region and from the second drain region to permanently alter a threshold value of the floating gate and store multi-bit data in the OTP device.

A further aspect of the invention concerns the fact that in some embodiments, the device has a multi-level (multi-bit) programmed state defined by an amount of charge stored on the floating gate by the variable programming voltage.

Other aspects of the invention concern methods of forming the aforementioned multi-level non-volatile programmable memory device.

Still other aspects of the invention concern methods of operating the aforementioned multi-level non-volatile programmable memory device. In preferred embodiments an amount of capacitive coupling can be adjusted based on altering a number of N (N>1) separate drain regions selected to overlap the floating gate and/or by altering a programming voltage level.

In instances where N=2, the threshold of the floating gate can be set to one of three (3) or four (4) different values as desired. When N=3 the threshold of the floating gate can be set to one of eight (8) different values, and so on. To read the state of the device, a read voltage is preferably controlled to have a range of values which vary in time corresponding to threshold states of the floating gate.

The multi-state device is preferably programmed with channel hot electrons that alter a voltage threshold of a floating gate, and erased with band-band tunneling hot hole injection. In some embodiments the device is adapted so that different ones of the first drain region and the second drain region can be coupled to the gate during program and read operations respectively. For example either, none or both the first drain region and the second region can be biased during a program operation, and only one of the first region and the second region can be biased during a read operation. Similarly, either or both of the first region and the second region can be biased during an erase operation.

Preferred embodiments of the multi-state device are n-channel, but p-channel can also be supported. In some applications the floating gate can be implemented as a multi-level structure, as part of a thin film transistor, or even oriented in a non-planar configuration.

Another aspect of the invention concerns a single bit NV memory which shares similar structural, formation and operating characteristics as the multi-state device noted above.

Still another aspect concerns a one-time programmable (OTP) device comprising: a floating gate; wherein the floating gate is comprised of a material that is also shared by an interconnect and/or another gate for a transistor device also situated on the substrate and associated with a logic gate and/or a volatile memory; a source region; and a drain region overlapping a portion of the floating gate, and the drain region including at least a first drain region and a second selectable drain region; wherein a variable capacitive coupling between the drain region and the floating gate can be effectuated by one or more selection signals applied to the first drain region and the second drain region respectively; wherein the variable capacitive coupling causes a variable amount of channel hot electrons from the first drain region and from the second drain region to permanently alter a threshold value of the floating gate and store data in the OTP device.

The OTP device can be similarly configured structurally and operationally as the multi-level device noted above. That is, an amount of capacitive coupling can be adjusted based on controlling/selecting a number of N (N>1) separate drain regions, or the size of an overlap with the floating gate, or using a variable programming voltage.

The devices are preferably embedded in a computing circuit and formed entirely by masks/CMOS processing used to form other logic and/or memory n-channel devices in the processing circuit. In some instances the non-volatile programmable memory device is used to store one or more identification codes for die/wafers.

It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions. While described in the context of a non-volatile memory array, it will be apparent to those skilled in the art that the present teachings could be used in any number of applications.

DESCRIPTION OF THE DRAWINGS

FIG. 6A is a top down view of a preferred embodiment of a non-volatile memory cell of the present invention which uses variable coupling;

DETAILED DESCRIPTION

The present disclosure concerns a new type of non-volatile memory device structure (preferably single poly) that can be operated either as an OTP (one time programmable) or as an MTP (multiple time programmable) memory cell using variable capacitive coupling. The preferred device structure is fully compatible with advanced CMOS logic process, and would require, at the worst case, very minimal additional steps to implement.

A unique aspect of the present device is that the floating gate of the memory cell structure is electrically coupled strongly through a variable number of S/D junctions of the transistor, whereas traditional single poly nonvolatile memory cells require either an additional interconnect layer to couple to the floating gate, or the floating gate has virtually none or minimal electrical coupling to any of the existing electrical signals. Moreover, unlike the 2008/0186772 reference, the coupling ratio can be more specific and precise. That is, by exactly controlling the coupling ratio (through areal means) the amount of charge, and thus the final programmed Vt, are directly proportional to the product of the coupling ratio and the drain voltage. It can be more precisely controlled such that the coupling ratio is dictated or designed by the desired programming threshold level ($V_t$) of the memory cell. This allows for a design that evolves easily into a multi-level version of an OTP since different coupling ratios yield different programmed $V_t$.

Figure 1:
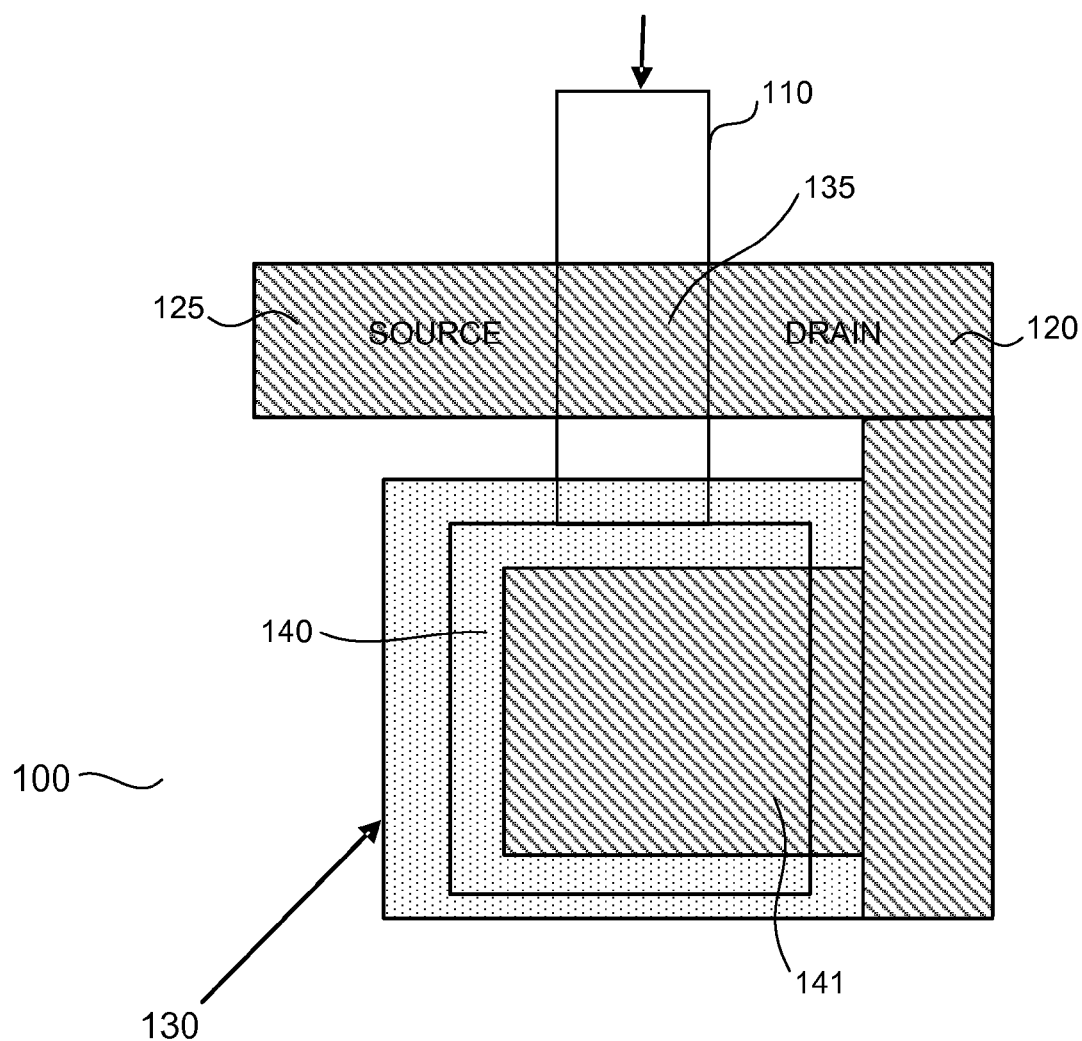
FIG. 1 is a top down view of a preferred embodiment of a non-volatile memory cell of the present invention.
Figure 2:
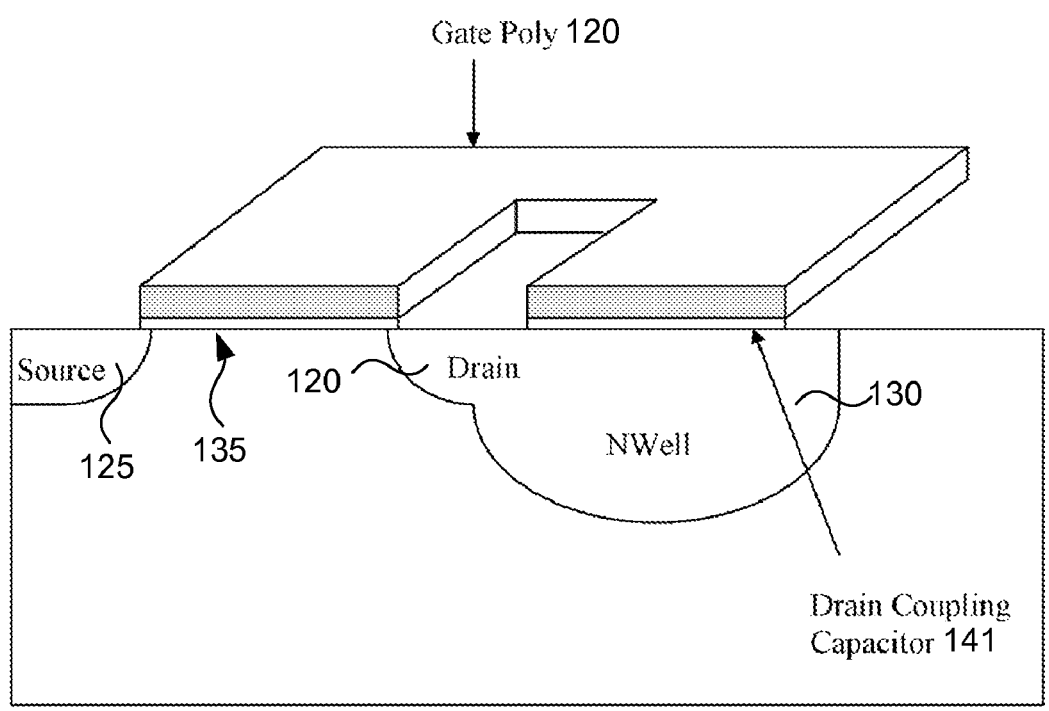
FIG. 2 is a side cross section view of the preferred non-volatile memory cell.

FIG. 1 illustrates the top view of the layout of a preferred structure used in the present invention. FIG. 2 illustrates a representative cross-sectional view of the device structure. It will be understood that these drawings are not intended to be set out to scale, and some aspects of the device have been omitted for clarity.

The device includes a typical NMOS transistor 100 which is modified so that the gate (poly in a preferred embodiment) 110 of the device is not electrically connected to a voltage source. A drain 120 of the device is bent around and is preferably joined by an N-type well 130 that typically already exists in a conventional advanced CMOS process. As an alternative, the N-Well 130 can be replaced with an n-type diffusion layer introduced so as to be beneath the poly floating gate. A conventional source region 125 is also utilized.

The floating gate poly 110 is extended beyond a typical transistor channel region 135 and includes an overlap region 140 which overlaps an active region extending from the drain junction. The active region portion 141 that is surrounded by the N-Well region serves as an effective capacitive coupling to the floating gate. Thus any voltage applied to the drain junction will be effectively coupled onto the floating gate.

Figure 3:
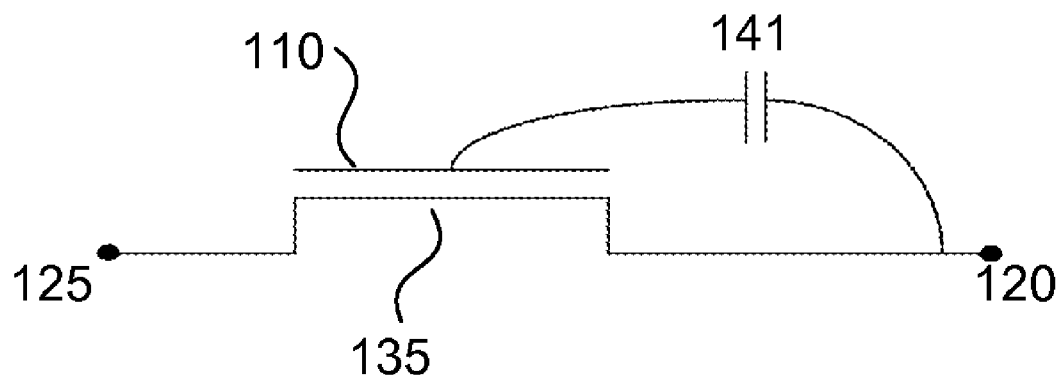
FIG. 3 is an electrical diagram illustrating the electrical relationship of the structures of the preferred non-volatile memory cell.
Figure 4:
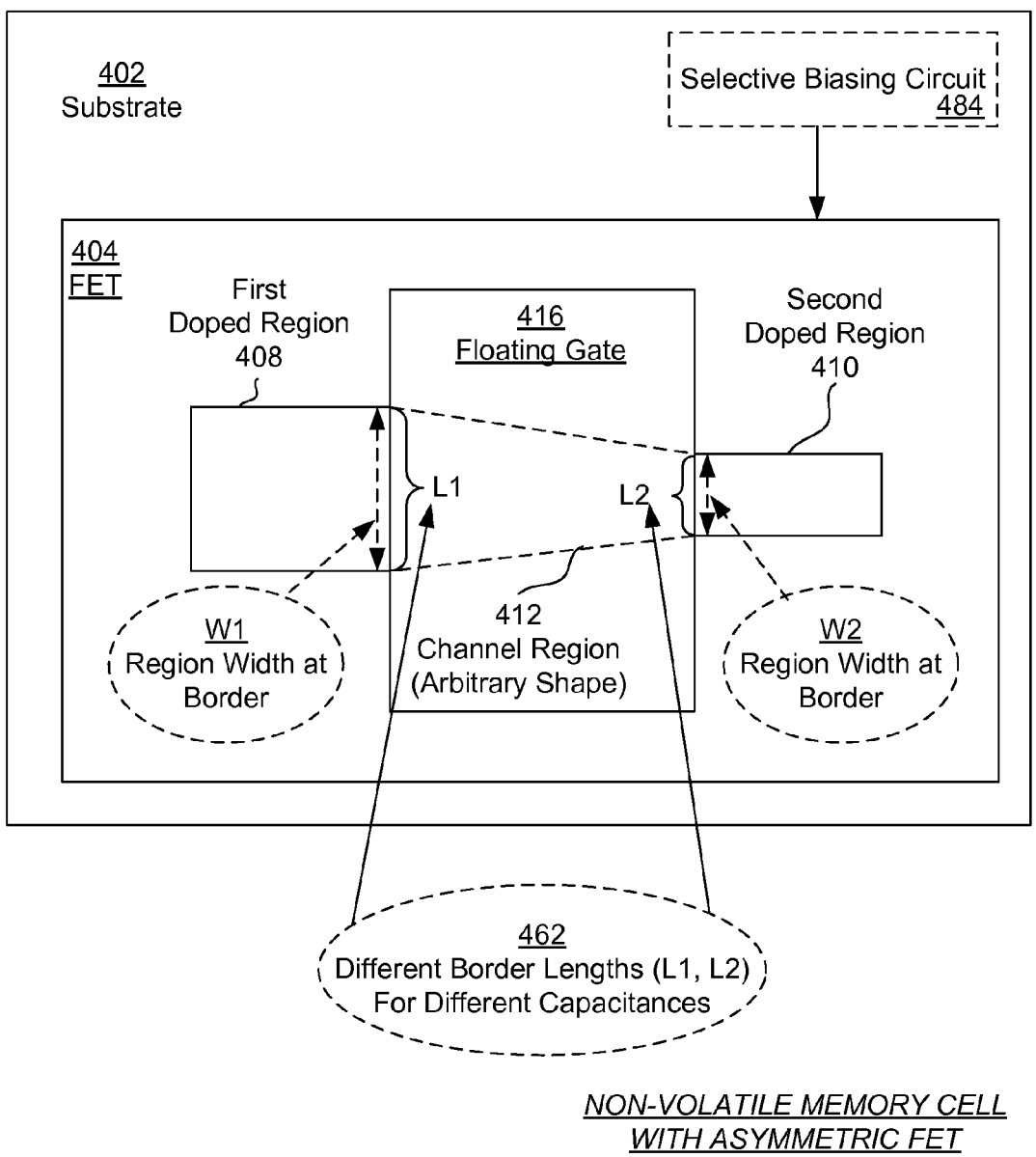
FIG. 4 depicts a prior art non-volatile memory cell which uses a floating gate for an OTP application.

As seen in the electrical diagram of FIG. 3, if the coupling ratio of the drain to the floating gate is sufficiently high—which is determined by the ratio of the area of the gate channel region and the area of the Poly extension overlapping the drain extension region—the floating gate can effectively acquire and have a high percentage of the value of the drain voltage.

A key advantage of the preferred embodiment, as seen in FIGS. 1 and 2, is that it is formed from same layers conventionally used to make active n-channel devices in a CMOS process. The only difference is that the poly (or metal as the case may be) gate layer is not interconnected with such other formed active devices or coupled to a gate signal. The other implants for the source/drain are also part of a CMOS conventional process. Thus, in most applications the invention can be integrated without any additional processing costs, because the only alteration is to an existing mask for each relevant layer of the wafer being processed.

One other optional variation of this device structure is to make the drain-to-gate coupling capacitor area on the sidewall of a trench. This will greatly reduce the area of the drain-to-gate coupling capacitor. This reduction in cell area may come at the expense of significantly increase the manufacturing process complexity. However, again, in applications where the invention is integrated with certain types of DRAM architectures (especially embedded types), it is possible to incorporate the conventional processing steps for such memories to avoid additional processing costs. Other techniques for coupling a voltage to the floating gate and achieving a desired coupling ratio will be apparent to those skilled in the art.

While the floating gate is shown as a single polysilicon layer, it will be appreciated by skilled artisans that other materials could be used as well. In some applications for example it may be possible to exploit the formation of other structures/devices which while part of other main underlying logic/memory structures, can be exploited for purposes of making a floating gate of some kind. In this respect it should be noted that floating gates can typically be formed of a number of different materials, including through techniques in which impurities are implanted/diffused into a dielectric/insulating layer.

Moreover while the preferred embodiment depicts the NVM cell as part of a conventional lateral—planar FET structure on a substrate, it will be apparent to those skilled in the art that other geometries/architectures can be used, including non-planar structures. Thus the invention could be used in SOI substrates, in thin film structures, at other levels of the device than the substrate, in multi-gate (FINFET type) orientations, and in vertical/non-planar configurations. In such latter instances the floating gate would be embedded and oriented vertically with respect to the substrate.

The preferred operation of device 100 will be described. The non-volatile device structure preferably has the physical features of a conventional I/O transistor implemented in an advanced CMOS logic process. At present, such I/O transistor is nominally operated at 3.3V but it will be understood that this value will change with successive generations of manufacturing.

This type of I/O transistor typically has a threshold voltage of 0.5V to 0.7V, with a typical electrical gate oxide thickness of 70 A. With a drain coupling to floating gate ratio of 0.90, and a read drain voltage of 1.0V applied to the device, the floating gate will effectively be coupled with a voltage of about 0.90V. This is sufficient to turn on the un-programmed NMOS device 100, and a channel current can be detected by typical means of sense circuitry to identify the state of the device. It will be understood to those skilled in the art that the particular coupling ratio, read voltage, etc., will vary from application to application and can be configured based on desired device operating characteristics.

The device is originally in a unprogrammed state, which in the preferred embodiment is characterized by a low resistance coupling between the source and drain through channel region 135. This means that the channel region 135 can be substantially uniform and current flow is reliable. While the preferred embodiment is shown in the form of a symmetric cell/channel, it will be understood that the invention could be used in non-symmetric forms such as shown in the aforementioned 20080186722 publication.

To program the device into a programmed state, the device must be shut off by reducing carriers in the channel region, and increasing the threshold voltage. To do this a drain voltage of 6.0V can be applied and this will effectively couple a voltage of about 5.4V to the floating gate. This bias condition will placed the device into a channel hot electron injection regime. The electrons injected into the floating gate effectively increase the threshold voltage of the device. When a subsequent read voltage of 1.0V is applied again on the drain, the device does not conduct current due to its high threshold voltage, and this second state of the device is thus determined. As with the read characteristics, it will be understood to those skilled in the art that the particular coupling ratio, program voltage, etc., will vary from application to application and can be configured based on desired device operating characteristics.

The prior art referred to above is primarily a one time programmable device, since there is no disclosed mechanism for removing the charge on the floating gate. In contrast, some embodiments of the present invention can be made to be capable of multiple-time-programming. To do this, an erase operation can be introduced to remove or neutralize the electrons that have been injected into the floating gate. The mechanism for removing or neutralizing electrons is preferably through band-band tunneling hot hole injection from the other non-coupling junction 125 of the device. The preferred bias condition would be as followed: the non-coupling junction (source junction) is biased with 6V to cause the junction to initiate band-band tunneling current. The band-band tunneling current causes hot holes to be injected into the floating gate and neutralize the electrons that are stored on the floating gate. Thus it is (re)programmed from a non-conducting, or even a low conducting state, into a conducting state. The device is then able to conduct channel current when a subsequent read voltage is applied to the coupling junction during the read operation. It will be understood that programming from a low conducting state to a conducting state may have a limited operating sense window.

As an additional optional operation, to facilitate erase operation and enhance band-band tunneling current, the coupling junction can be supplied with a negative voltage so that the floating gate is made more negative to cause higher band-band tunneling current across the source junction.

Thus the operating characteristics are preferably as follows:

| OPERATION | Drain | Source | Substrate |
|---|---|---|---|
| Program | 6.0 V | 0 V | 0 V |
| Read | 1.0 V | 0 V | 0 V |
| Erase | Float or −Vcc | 6.0 V | 0 V |

Figure 5:
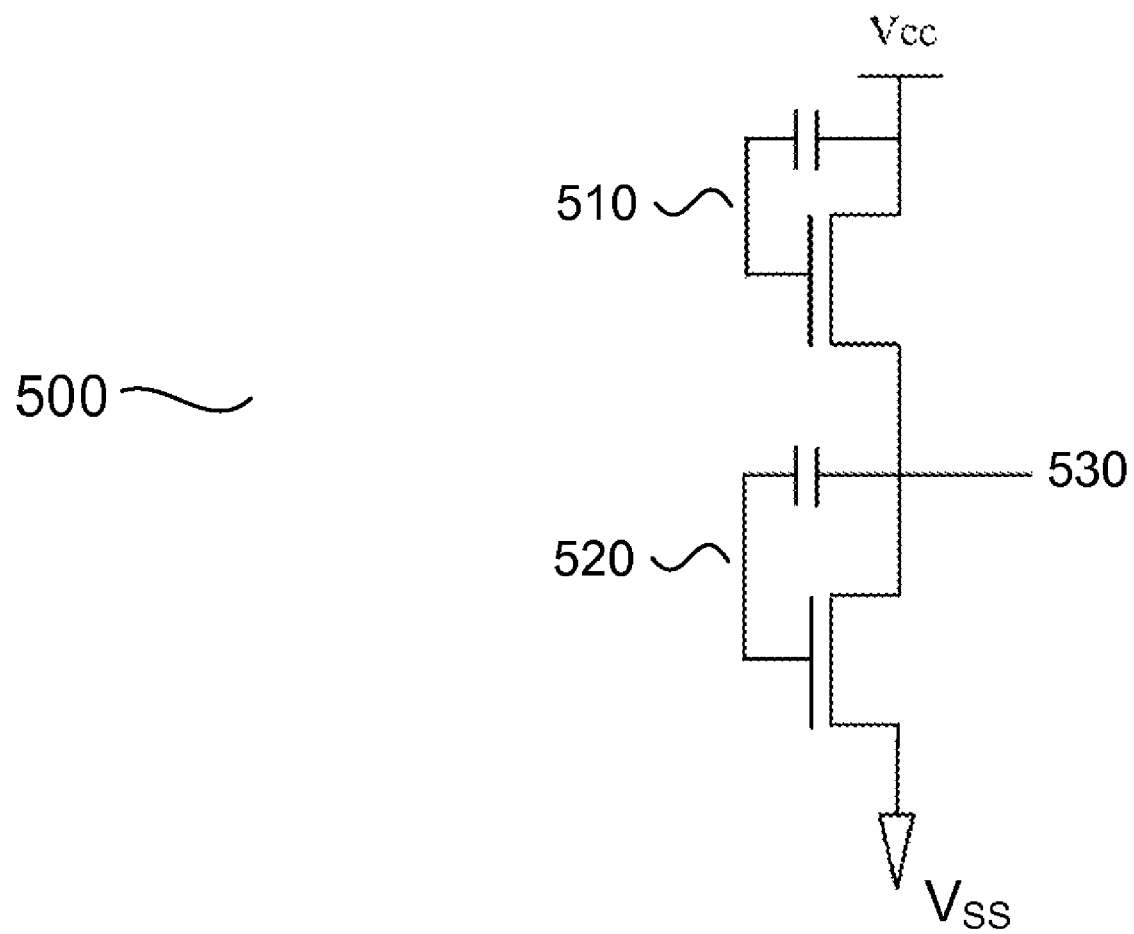
FIG. 5 is an electrical diagram showing a preferred embodiment of a latch circuit constructed with the NV memory cells of the present invention.

In some embodiments, additional protection can be implemented to ensure the OTP and MTP device have sufficient immunity against the loss of charge stored on the floating gate. To do this, the device can be configured into a paired latch 500—as shown in FIG. 5—where the data and its complement are stored into the latch, thus effectively doubling the margin in the stored data. As seen therein, a top device 510 couples a node 530 to a first voltage reference (Vcc) while a second bottom device 520 couples the node to a second voltage reference (Vss). By placing charge on the top device floating gate, the top device 510 is programmed into a non-conductive state, thus ensuring that node 530 is pulled down by bottom device 520 to Vss, representing a first logical data value (0). Similarly, by placing charge on the bottom device floating gate, the bottom device 520 is programmed into a non-conductive state, thus ensuring that node 530 is pulled up by top device 510 to Vcc, representing a second logical data value (1).

Another useful advantage of the present preferred embodiment is that it is implemented with an NMOS device structure, whereas most traditional single-poly OTPs are commonly implemented with a PMOS device structure. This means that the device can be formed at the same time as other n-channel devices on a wafer. Another advantage of an NMOS device structure in this invention is that it behaves similar to an EPROM device, i.e., the device is programmed into a non-conducting state from a conducting state. In contrast, the prior art 20080186722 type device—and other commonly used PMOS OTP devices—are programmed from a non-conducting state into a conducting state. This aspect of the invention thus can eliminate the need of an additional masking step that is commonly associated with a PMOS OTP device in order to make sure that PMOS device is in a non-conducting state coming out of the manufacturing fab.

In addition, since an NMOS device's programming mechanism with channel hot electrons injection is self-limiting, unlike that case of a PMOS with channel hot electron programming, the amount of energy consumption during programming is self-limited for this invention.

As seen in the present description therefore, the particular configuration of the floating gate is not critical. All that is required is that it be structurally and electrically configured to control channel conduction and also be capacitively coupled to an electrical source of charge carriers. The particular geometry can be varied in accordance with any desired layout or mask. In some instances it may be desirable to implement the floating gate as a multi-level structure for example. Moreover, since capacitive coupling is a function of the materials used, the invention allows for significant flexibility as the composition of the floating gate can also be varied as desired to accommodate and be integrated into a particular process. An array of cells constructed in accordance with the present teachings could include different shapes and sizes of floating gates so that cells having threshold cells could be created.

Variable Coupling

In other embodiments of the invention, the effective coupling ratio of the device 100 can be made different/varied between read, program and/or erase operations. That is, while not shown in FIGS. 1, 2, the drain region 120 coupled to the floating gate could be partitioned into one or more separate sub-regions. This is shown in detail in FIGS. 6A and 6B. Each sub-region 121, 122, etc. may be fabricated or controlled to have a different amount of overlap with the floating gate. By selectively applying a different voltage for one or more of such sub-regions, differing types of performance can be achieved for read/program/erase operations. For example it may be desirable to have an ultra low power (but somewhat slower) program or erase operations. This can be achieved by making a coupling area for such first type of operation smaller than the nominal area used during a second type (read) operation.

Figure 6B:
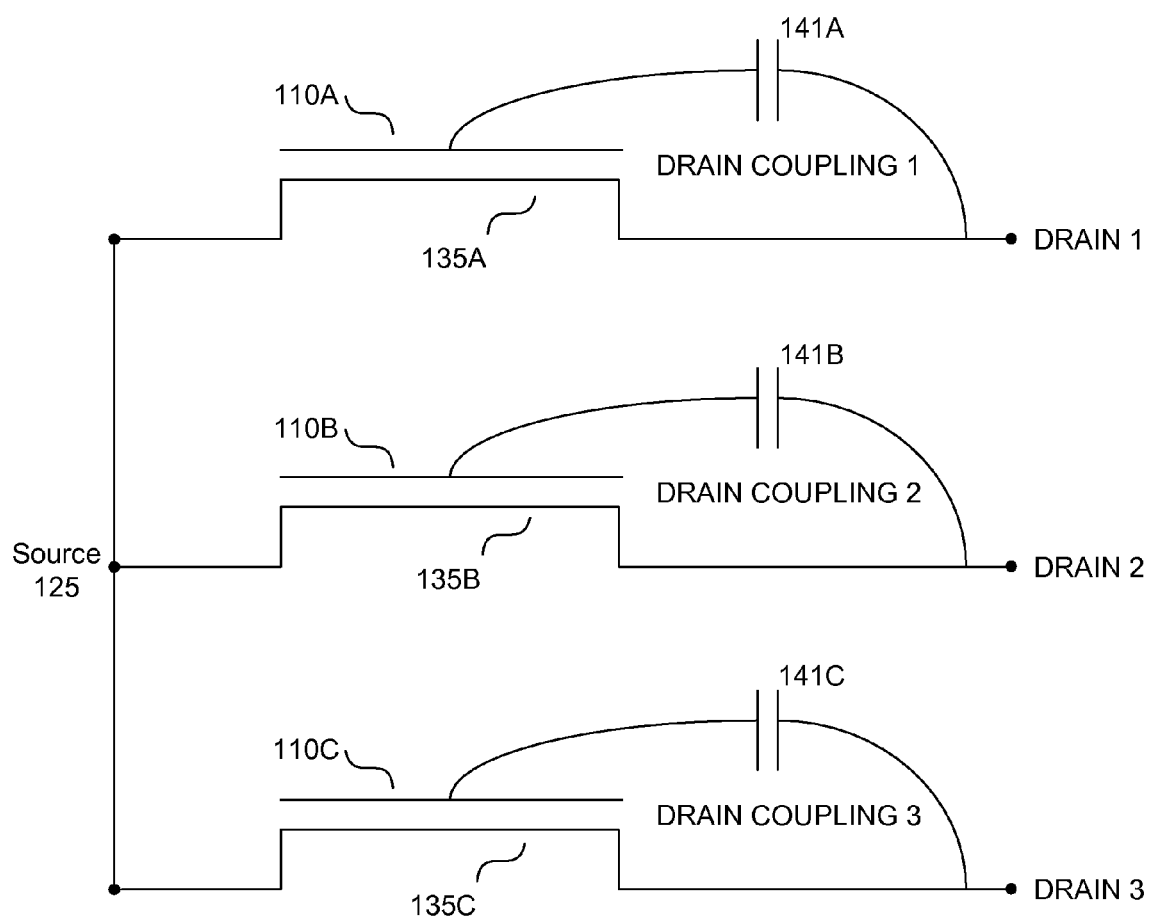
FIG. 6B is an electrical diagram illustrating the electrical relationship of the structures of the preferred non-volatile memory cell using variable coupling.

While in FIGS. 6A and 6B the variable coupling geometry is done by altering a drain diffusion size (in a diffusion mask) and keeping a floating gate size constant, it will be apparent to those skilled in the art that the same effective result could be achieved by keeping a drain diffusion constant and altering a floating gate size. For example the floating gate region 122 could be reduced in size to achieve the same result. By adjusting floating gate sizes it then becomes possible to share diffusion regions as well, so that an adjacent floating gate 122' (for another cell) could be coupled to drain region 120. Other combinations of these techniques will be useable as well and can be selected based on design/performance requirements.

Notably, the variable coupling aspects of the present invention can be used for both PMOS and NMOS OTP. Different coupling ratio options could also be used to impart different voltages on the floating gate, which has the potentially for multi-state storage, i.e., multi-level for an OTP.

As an alternative embodiment the programming voltage could be adjusted instead of course, so that for a given drain coupling, the programming voltage applied to a particular cell is adjusted to write a different state to the floating gate. Because the drain is coupled to the floating gate the variable programming voltage should be imparted to the floating gate. For example, a drain voltage could be adjusted to have 3, 4 or more different levels. This effectuates a different form of variable capacitive coupling that may be more complex from a write perspective but may be useful in some applications.

A multi-level OTP variant for an NMOS implementation must take into account that NMOS is programmed to an off state, so a little off is very similar to very much off, unless one uses different level of floating gate voltages through different applied drain voltages to sense the state. In such circumstances, however, the different drain voltage could undesirably degrade the read disturb immunity, so there is a potential trade off here.

Another option for multi-level capability is this: since different drain to gate capacitance options are used (via different overlap area) to select a programming state, a read operation can be performed through the same single drain overlap in order to detect the multi-state of the cell. For example, with two different drain overlaps, a total of 2 bits could be implemented. In such an implementation, Drain 1 can be set to have a coupling ratio (or overlap) which is some multiple (in this case preferably 2) of that of Drain 2.

As the table shows below, a program voltage which imparts Drain 1 with a voltage of 0 and Drain 2 with a voltage of 6 V would write a first state in the cell, based on a first amount of charge imparted to the gate. If instead all drains are programmed the charge added would be higher, thus corresponding to a second state, and so on.

A total of four (4) different couplings (0 (no drains), 1×(Drain 2), 2×(Drain 1), 3×(both Drain 1 and Drain 2)) corresponding to four different threshold voltages, and thus four different logic states is achievable with this simple arrangement.

The preferable method of reading the state of the cell applies a read voltage on both Drain 1 and Drain 2 as seen in Table 2 below. The amount of cell current is then sensed, which current is inversely proportional to the amount of charge on the floating gate. The charge on the floating gate as noted above is a direct function of the amount of coupling applied during the programming. Thus the state of 0, 1×, 2× and 3×in the cell can be detected by its relationship to the amount of read current. In this embodiment the read drain voltage is preferably selected to be on the order of 1 volt. This has the advantage of preventing any kind of read disturb or drain induced leakage contribution.

As an alternative which allows less decoding during read operation, the read can always be done on the Drain node with the highest coupling ratio, in our example, the 2× Drain. In such instances it may not be possible to differentiate between all 4 different states, but this may be a desirable trade off in some applications.

As also shown in Table 2, as a further alternative to read the multi-level cell state, any single one (or combination) of the drains is biased with a varying voltage over time to determine the coupled charge contribution from the collective overlaps. The drain is biased with an increasing voltage (from 0 to some target voltage sufficient to trigger the gate in the highest threshold state) with time until the threshold voltage is achieved or decoded within a certain time interval at a particular voltage level to identify the state of the cell. Thus while all or some drains are biased during a program operation, only a single drain need be biased (although others can, as above) during a read to determine the state of the cell. The particular range of read drain voltages will be dependent on the particular cell architecture, desired operating characteristics, etc. and can be determined by routine testing. Again in this embodiment may not be possible to differentiate between all 4 different states, but this may be a desirable trade off in some applications. Other examples for programming and reading the cell will be apparent to those skilled in the art.

| OPERATION | Drain 1 | Drain 2 | Source | Substrate |
|---|---|---|---|---|
| Program | 0 or 6 V | 0 or 6 V | 0 V | 0 V |
| Read | 1 volt (or 0 - N volts in M volt increments) | 1 volt (or 0 - N volts in M volt increments) | 0 V | 0 V |
| Erase | Float or –Vcc | Float or –Vcc | 6.0 V | 0 V |

Other ratios are possible, of course, subject to the restriction that by selecting different ratios which are not multiples of 2, the sensing margin/differentiation may not be as great. However, in some instances it may be desirable to set the respective overlaps to some higher/lower multiple, which would have the effect of reducing a sense margin between two adjacent states at some range of output. If there is an imbalance in the sensitivity of the sense range, however, this may be a desirable option (i.e., if it is easier to detect the difference between 1× and 2× than it is for 4× and 5× or vice versa). Furthermore in some cases it may be satisfactory to reduce the number of effective logic states by sacrificing one of the combinations to result in an odd number of logic states. For example, a multi-bit cell may have 3 programmed drain couplings simply of {0, Drain 1, Drain 2} thus ignoring {Drain 1+Drain 2}.

While two separate coupling ratios are shown in FIG. 6A and three separate coupling ratios are shown in FIG. 6B, it will be understood that other partitionings and couplings could be implemented in accordance with the present teachings. In the case of FIG. 6B, for example, 8 different programmed states can be achieved by using 3 different levels of charge coupling. For example, different combinations of drains having coupling ratios of 1×, 2× and 4× can be combined, or some other set of ratios. Again, other selections could be made with fewer logic states in exchange for higher margin between states. Other variations of the invention will be apparent to those skilled in the art.

The above descriptions are intended as merely illustrative embodiments of the proposed inventions. It is understood that the protection afforded the present invention also comprehends and extends to embodiments different from those above, but which fall within the scope of the present claims.

What is claimed is:

1. A programmable multi-state non-volatile device situated on a substrate comprising:
   a floating gate;
   wherein said floating gate is comprised of a material that is also used as a gate for a transistor device also situated on the substrate and associated with a logic gate and/or a volatile memory;
   a source region; and
   a drain region; and
   an n-channel coupling said source region and said drain region;
   wherein the drain region overlaps a sufficient portion of said gate such that a programming voltage for the device applied to said drain can be imparted to said floating gate through areal capacitive coupling;
   further wherein the device is adapted so that more than one bit of information can be stored by said programming voltage.

2. The programmable device of claim 1 wherein the device is adapted such that during a read operation only a portion of said drain region receives a read voltage.

3. The programmable device of claim 1 wherein the device is adapted such that a portion or all of said drain region can be biased during a program operation to vary an amount of information stored in the device.

4. The programmable device of claim 1 wherein said floating gate can be erased.

5. The programmable device of claim 4 wherein said device can be re-programmed.

6. The programmable device of claim 4 wherein said floating gate is eraseable by an erase voltage applied to said source region.

7. The programmable device of claim 1 wherein said device is part of a programmable array embedded with separate logic circuits and/or memory circuits in an integrated circuit.

8. The programmable device of claim 7 wherein said device is associated with one of the following: a data encryption circuit; a reference trimming circuit; a manufacturing ID; and/or a security ID.

9. The programmable device of claim 1, wherein said capacitive coupling takes place in a first trench situated in the substrate.

10. The programmable device of claim 9, wherein a set of second trenches in said substrate are used as embedded DRAM.

11. The programmable device of claim 1, further including a second programmable device coupled in a paired latch arrangement such a datum and its compliment are stored in said paired latch.

12. The programmable device of claim 1, wherein the device is adapted to be read by a bias voltage applied to said drain region which is adjusted with time to determine a threshold voltage of said floating gate.

13. The programmable device of claim 1, wherein the device is programmed to a multi-level state by a variable programming voltage.

14. A multi-level programmable device situated on a substrate comprising:
   a floating gate; said floating gate being comprised of a material that includes impurities acting as charge storage sites and is also used as an insulating layer for other non-programmable devices situated on the substrate;
   a source region; and
   a drain region comprised of a first drain region and a second drain region; and
   wherein the drain region overlaps a sufficient portion of said gate such that a programming voltage for the device applied to said drain can be imparted to said floating gate through areal capacitive coupling;
   further wherein the device is adapted so that multiple bits of data can be written by said programming voltage.

15. The multi-level programmable device of claim 14 wherein said first drain region and a second drain region have different amounts of areal overlap with said gate.

16. The multi-level programmable device of claim 14 wherein said first drain region has an amount of areal overlap with said gate which is a multiple of that of said second drain region with said gate.

17. The multi-level programmable device of claim 14 wherein a read signal is only applied to one of said first drain region and said second drain region to decode said multiple bits of data.

18. The multi-level programmable device of claim 14 wherein a read signal voltage value is adjusted over time to decode said multiple bits of data.

19. The multi-level programmable device of claim 14 wherein the device is adapted to store an odd number of bits based on an areal coupling of: 1) said first drain region alone; 2) said second drain region alone; or 3) both or neither of said first or second drain regions.

20. The multi-level programmable device of claim 14, wherein said areal capacitive coupling takes place over a C-shaped area.

21. A multi-level one-time programmable (MOTP) device situated on a substrate comprising:
   a floating gate;
   wherein said floating gate is comprised of a material that is also shared by an interconnect and/or another gate for a transistor device also situated on the substrate and associated with a logic gate and/or a volatile memory;
   a source region; and
   a drain region overlapping a portion of said floating gate, and said drain region including at least a first drain region and a second selectable drain region;
   wherein a variable areal capacitive coupling between said drain region and said floating gate can be effectuated by one or more selection signals applied to said first drain region and said second drain region respectively;

wherein said variable capacitive coupling causes a variable amount of channel hot electrons from said first drain region and from said second drain region to permanently alter a threshold value of said floating gate and store multi-bit data in the OTP device.

22. The MOTP device of claim 21 wherein said first drain region and a second drain region have different amounts of areal overlap with said gate.

23. The MOTP device of claim 21 wherein said first drain region has an amount of areal overlap with said gate which is a multiple of that of said second drain region with said gate.

24. The MOTP device of claim 21 wherein a read signal is only applied to one of said first drain region and said second drain region to decode said multiple bits of data.

25. The MOTP device of claim 21 wherein a read signal voltage value is adjusted over time to decode said multiple bits of data.

26. The MOTP device of claim 21 wherein the device is adapted to store an odd number of bits based on an areal coupling of: 1) said first drain region alone; 2) said second drain region alone; or 3) both or neither of said first or second drain regions.

27. The multi-level programmable device of claim 21, wherein said areal capacitive coupling takes place over a C-shaped area.

28. A multi-level programmable memory device with a gate, an n-type impurity source and an n-type impurity drain on a silicon substrate comprising:

an n-type channel; and wherein the n-type impurity drain overlaps a sufficient portion of said gate such that a variable programming voltage applied to said n-type impurity drain can be imparted to said gate through areal capacitive coupling and cause a multi-level logic state to be stored in the device;

said gate being adapted to function as a floating gate so that the device has a multi-level programmed state defined by an amount of charge stored on said gate by said variable programming voltage;

further wherein said charge on said floating gate can be erased so as to permit the device to be re-programmed.

29. A multi-level one-time programmable (MOTP) memory cell with a gate, an n-type impurity source and an n-type impurity drain on a silicon substrate comprising:

an n-type channel; and wherein the n-type impurity drain is adapted to overlap a variable portion of said gate such that a voltage applied to said n-type impurity drain can be imparted to said gate through areal capacitive coupling;

said gate being adapted so that the MOPT cell has a programmed state defined by a charge state of said gate, which charge state corresponds to a plurality of bits of data.

30. The MOTP memory cell of claim 29 wherein said variable portion of said gate overlaps a first area of a first drain region and overlaps a second different sized area of a second drain region within said n-type impurity drain for the cell.

31. The MOTP memory cell of claim 30 wherein a read signal is only applied to one of said first drain region and said second drain region to decode said multiple bits of data.

32. The MOTP memory cell of claim 30 wherein the device is adapted to store an odd number of bits based on an areal coupling of: 1) said first drain region alone; 2) said second drain region alone; or 3) both or neither of said first or second drain regions.

33. The MOTP memory cell of claim 29 wherein a read signal voltage value is adjusted over time to decode said multiple bits of data.

34. The MOTP memory cell of claim 29, wherein said areal capacitive coupling takes place over a C-shaped area.

35. A method of forming a multi-level non-volatile programmable memory device situated on a substrate comprising:

forming a gate for non-volatile programmable memory device from a first layer;

wherein said first layer is shared by the non-volatile programmable memory device and at least one other device also situated on the substrate and associated with a logic gate and/or a volatile memory;

forming a drain region comprised of a first drain region and at least one separate second drain region; and capacitively coupling said gate with said drain region by overlapping an areal portion of said gate with both said first drain region and said at least one second drain;

wherein the multi-level non-volatile memory device is adapted so that more than one bit of information can be stored in response to a programming voltage.

36. The method of claim 35 wherein the device is adapted such that during a read operation only a portion of said drain region receives a read voltage.

37. The method of claim 35 wherein the device is adapted such that a portion or all of said drain region can be biased during a program operation to vary an amount of information stored in the device.

38. The method of claim 35, wherein the device is adapted wherein the device is adapted to be read by a bias voltage applied to said drain region which is adjusted with time to determine a threshold voltage of said floating gate.

39. A method of operating a multi-level one-time programmable (MOTP) cell situated on a substrate comprising:

providing a floating gate;

wherein said floating gate is comprised of a material that is also shared by an interconnect and/or another gate for a transistor device also situated on the substrate and associated with a logic gate and/or a volatile memory;

providing a source region; and providing a drain region overlapping a variable portion of said floating gate and capacitively coupled thereto;

wherein an amount of capacitive coupling can be adjusted based on altering a number of N (N>1) separate drain regions selected to overlap said floating gate and/or by altering a programming voltage level;

setting a threshold of said floating gate based on a current of channel hot electrons;

wherein said threshold can be set to more than two (2) separate distinguishable states to effectuate a multi-level storage cell.

40. The method of claim 39, wherein N=2 and said threshold of said floating gate can be set to one of four (4) different values.

41. The method of claim 39, wherein N=2 and said threshold of said floating gate can be set to one of three (3) different values.

42. The method of claim 39, wherein N=3 and said threshold of said floating gate can be set to one of eight (8) different values.

43. The method of claim 39, wherein N=2 and said threshold of said floating gate can be set to one of more than 2 but less than 8 different values.

44. The method of claim 39, wherein said threshold is determined by a read voltage applied to one or more of said N separate drain regions.

45. The method of claim 44, wherein said read voltage is controlled to have a range of values which vary in time corresponding to threshold states of said floating gate.

46. A method of operating a multi-level non-volatile programmable (MNVP) device situated on a substrate comprising:
providing a floating gate, which floating gate is comprised of a layer and material that is shared by gates of at least some other non-MNVP devices on said substrate;
programming the MNVP device to a first state with channel hot electrons that alter a voltage threshold of a floating gate;
wherein said channel hot electrons are provided by a variable number of drain regions which can be coupled to said floating gate and effectuate a multi-bit logic state for said first state;
reading the first state in the MNVP device using a bias current to detect said voltage threshold; and
erasing the MNVP device with band-band tunneling hot hole injection.

* * * * *